United States Patent
Grötsch et al.

(10) Patent No.: US 7,414,269 B2
(45) Date of Patent: Aug. 19, 2008

(54) HOUSING FOR A RADIATION-EMITTING COMPONENT, METHOD FOR THE PRODUCTION THEREOF, AND RADIATION-EMITTING COMPONENT

(75) Inventors: Stefan Grötsch, Lengfeld/Bad Abbach (DE); Patrick Kromotis, Penang (MY)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/558,461

(22) PCT Filed: May 28, 2004

(86) PCT No.: PCT/DE2004/001104

§ 371 (c)(1),
(2), (4) Date: Jul. 3, 2006

(87) PCT Pub. No.: WO2004/109812

PCT Pub. Date: Dec. 16, 2004

(65) Prior Publication Data

US 2007/0069227 A1    Mar. 29, 2007

(30) Foreign Application Priority Data

May 30, 2003    (DE) ................. 103 24 909

(51) Int. Cl.
*H01L 27/15* (2006.01)
*H01L 21/00* (2006.01)

(52) U.S. Cl. ............................ 257/81; 257/84; 257/99; 257/100; 257/678; 257/E33.056; 257/E33.058; 257/E33.059; 257/E25.032; 438/28; 438/29

(58) Field of Classification Search ............ 257/79–100, 257/113, 114, 116, 431, 678, 723, 918, E51.021, 257/E33.055, E31.105, E33.056–E33.059, 257/E25.032; 438/25–35, FOR. 417
See application file for complete search history.

(56) References Cited

U.S. PATENT DOCUMENTS

| 4,935,665 | A |   | 6/1990 | Murata |
| 5,084,804 | A |   | 1/1992 | Schairer |
| 5,534,718 | A |   | 7/1996 | Chang |
| 5,660,461 | A | * | 8/1997 | Ignatius et al. .............. 362/241 |
| 5,698,866 | A |   | 12/1997 | Doiron et al. |
| 6,531,405 | B1 | * | 3/2003 | Wegleiter et al. .......... 438/745 |

(Continued)

FOREIGN PATENT DOCUMENTS

DE    31 48 843    6/1983

(Continued)

OTHER PUBLICATIONS

International Preliminary Examination Report with regard to International Application No. PCT/DE2004/001104 issued by Examiner Ellen Moyse dated Apr. 18, 2006.

*Primary Examiner*—Jasmine J Clark
(74) *Attorney, Agent, or Firm*—Fish & Richardson P.C.

(57) ABSTRACT

The invention proposes a housing for at least two radiation-emitting components, particularly LEDs, comprising a system carrier (1) and a reflector arrangement (2) disposed on said system carrier (1), the reflector arrangement comprising a number of reflectors each of which serves to receive at least one radiation-emitting component and which are fastened to one another by means of a holding device (4).

19 Claims, 2 Drawing Sheets

| U.S. PATENT DOCUMENTS | | | |
|---|---|---|---|
| 6,921,926 B2 * | 7/2005 | Hsu | 257/98 |
| 2002/0084462 A1 | 7/2002 | Tamai et al. | |
| 2004/0047151 A1 | 3/2004 | Bogner et al. | |
| 2004/0262717 A1 | 12/2004 | Arndt et al. | |

FOREIGN PATENT DOCUMENTS

| DE | 100 14804 | 9/2001 |
|---|---|---|
| EP | 1 187 226 | 3/2002 |
| JP | 2001-085748 | 3/2001 |
| WO | WO 01/73844 | 10/2001 |
| WO | WO 02/17405 | 2/2002 |
| WO | WO 03/019677 | 3/2003 |

\* cited by examiner

HOUSING FOR A RADIATION-EMITTING COMPONENT, METHOD FOR THE PRODUCTION THEREOF, AND RADIATION-EMITTING COMPONENT

CROSS-REFERENCE TO RELATED APPLICATIONS

This patent application is the National Stage of International Application No. PCT/DE2004/001104, filed May 28, 2004, which claims the priority of German Patent Application Ser. No. 10321909.5, filed on May 30, 2003. The contents of both applications are hereby incorporated by reference in their entireties.

This patent application claims the priority of German Patent Application 103 24 909.5-33, whose disclosure content is hereby incorporated by reference.

FIELD OF THE INVENTION

The present invention concerns a housing for at least two radiation-emitting components, particularly LEDs, comprising a system carrier and a reflector arrangement.

BACKGROUND OF THE INVENTION

In LED arrays used for illumination and projection, system carriers made of metals, ceramics or semiconductors are frequently used to mount and/or dissipate heat from the LEDs. For the LEDs to produce directed radiation, each individual LED or set of more than one LED must be provided with a reflector, which is often made of plastic.

Such an arrangement known from the prior art is illustrated by way of example in FIG. 1. The radiation-emitting component depicted therein comprises exemplarily two LED chips 9, disposed in mutually spaced relation on a system carrier 1. As noted in the above introduction, this carrier is usually made of a metal, a ceramic or a semiconductor. To direct the radiation given off by the LED chips 9, a reflector arrangement 2 is provided, mounted directly on the system carrier 1. The connection can be made by means of an adhesive, for example. Reflector arrangement 2 comprises two reflectors 3, one LED chip 9 being deposited in each reflector 3. Reflector arrangement 2 has roughly the same expanse as system carrier 1, resulting in the creation of an extensive connection between these two elements.

Since the reflector arrangement, unlike the system carrier, is usually made of a plastic, which can be formed into the desired shape by injection molding, there is an extensive connection between two materials that have sharply differing thermal expansion coefficients. In the temperature range that occurs when the radiation-emitting component is in operation, owing to the different expansions of the system carrier 1 and the reflector arrangement 2 mechanical stress can develop, particularly in the lateral direction, and destroy the compound structure or its joining technique.

To prevent damage to the radiation-emitting component, in the prior art, intentional breakpoints are provided in the reflector arrangement. Arrangements of this kind are also known in which the reflector arrangement is composed of individual reflectors, each of which is mounted at a designated location on the system carrier. A disadvantage in both of these approaches is the technical expenditure involved in making the radiation-emitting component and its housing.

SUMMARY OF THE INVENTION

The object of the present invention is, therefore, to specify a housing for a radiation-emitting component and a radiation-emitting component that can be made simply and inexpensively, and with which mechanical problems due to the mechanical connection of different materials to one another can be substantially eliminated.

A housing according to the invention comprises a system carrier and a reflector arrangement disposed on the system carrier, said reflector arrangement comprising a number of reflector elements, each of which is assigned to at least one radiation-emitting component and which are connected to one another by a holding device to form an array.

Hence, the reflector arrangement is divided into individual reflector elements. However, these are not mounted individually on the system carrier as in the prior art, but instead are fastened together and fixed in their relative positions in a holding device. The holding device provided with the reflectors can be disposed on and fastened to the system carrier, resulting in a very simple production method.

Breaking down the reflector arrangement into individual reflector elements reduces the area of the interface where the usually plastic reflector elements and the metal, ceramic or semiconductor system carrier are in contact with each other. Thus, the temperatures that occur during operation cause very little mechanical tension due to thermal expansion, markedly increasing the reliability of the radiation-emitting component.

Since the individual reflector elements are connected to one another via the holding device, it is advantageous for the system carrier and the holding device to undergo similar thermal expansions in response to temperature changes—in particular, for them to be made of the same material. There is then no harm in the reflector arrangement being made of a different material, particularly of plastic having a different thermal expansion coefficient from the material or materials of the holding device and the system carrier.

To improve the reliability of the radiation-emitting component, it suffices if the system carrier and the holding device are simply matched to each other or have similar thermal expansion coefficients. It is, of course, particularly advantageous if the same materials are used for both of these elements. If an aluminum, for example, is used for the system carrier, then it is particularly expedient for the holding device to be made of aluminum as well.

Production is particularly simple if the holding device is an electrical leadframe. This can be formed into the desired shape in a simple manner by the known production methods, particularly stamping and bending operations.

In a preferred embodiment, the holding device comprises at least one recess, each recess having at least one reflector element formed onto its wall so as to enter into a firm connection therewith. To make an LED array for illumination or projection, the holding device will have a plurality of recesses, for example arranged in a defined grid. The recesses can be produced in a simple manner by a stamping process. The reflectors are preferably formed on by means of an injection molding or transfer molding process of the kind known from plastics technology.

It is particularly advantageous if exactly one reflector element is formed in each recess. The reflector can in this case serve to receive one LED or a plurality of LEDs present in the form of a set.

Providing the inventive holding device also permits the use thereof as a wiring plane for the radiation-emitting components. The LEDs are preferably arranged on the system carrier, by means of which the first electrical contact can be established. The second hook-up to the LED can then be made via the holding device, which provides a suitable conduction route.

In a further advantageous embodiment, the holding device comprises a mounting frame by means of which the holding device carrying the reflector arrangement can be mounted on the system carrier. The mounting frame is preferably arranged surroundingly around the reflector arrangement and is connected to the system carrier by positive engagement. The mounting frame thus embraces all of the reflectors and LEDs. It makes it possible to mount the holding device provided with the reflectors on the system carrier in a simple manner, e.g. by means of a screw connection, and further enables the space formed between the mounting frame, the system carrier and the holding device to be potted with a potting compound.

In a further advantageous embodiment, the holding device comprises terminal strips that can be used as contacts for surface mounting. The terminal strips, which are present for example in the form of leads and can also be fabricated by a stamping process, can be passed through the surrounding mounting frame and then connected to a circuit board or the system carrier either by being plugged in or as surface mount technology (SMT) contacts.

BRIEF DESCRIPTION OF THE DRAWINGS

Further advantages, features and suitabilities of the invention will emerge from the exemplary embodiments described below in connection with FIGS. 2 to 5. In the drawing.

Figure 1:
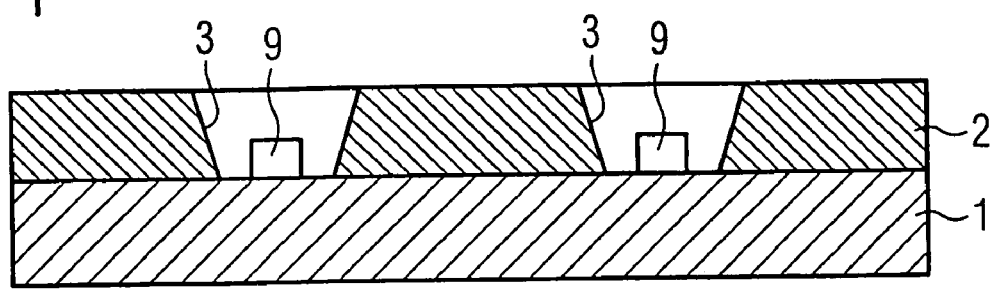
FIG. 1 is a schematic representation of a radiation-emitting component known from the prior art and described in the introduction hereto, comprising two LEDs.

In all of the exemplary embodiments, like or like-acting elements have been provided with the same respective reference characters.

DETAILED DESCRIPTION OF THE PREFERRED EMBODIMENTS

Figure 2:
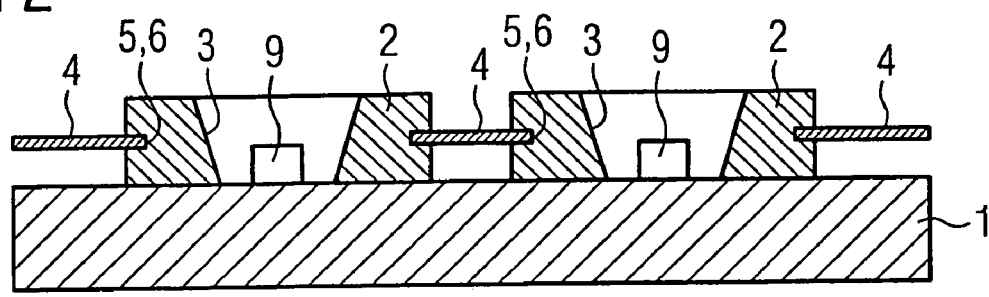
FIG. 2 is a schematic representation of a first exemplary embodiment in cross section.

The exemplary embodiment depicted in FIG. 2 comprises a system carrier 1, made for example of a metal, a ceramic or a semiconductor. Disposed thereon is a reflector arrangement 2. Reflector arrangement 2 is comprised, merely exemplarily, of two reflectors 3 formed onto a holding device 4. Reflector arrangement 2 is made of a plastic material. Holding device 4 comprises two recesses 5, each with reflectors 3 formed onto their sides. The recess and thus the associated reflectors are provided at the locations where LEDs 9 are to be mounted on the system carrier 1. In addition to its holding function serving to connect adjacent reflectors 3, holding device 4 can also be used as an additional wiring plane comprising the electrical connection paths for the LEDs 9.

Holding device 4 is preferably made of the same material as system carrier 1. However, it at least comprises a material that is matched with or adapted to the material of system carrier 1 with respect to thermal expansion coefficient. If, for example, system carrier 1 is fashioned of aluminum, then holding device 4 is preferably also made of aluminum. In the case of a ceramic system carrier made of, for example, AlN/Al$_2$O$_3$, iron/nickel alloys can be used for the holding device.

Holding device 4 is preferably fabricated as a leadframe made of a metallic material. The recesses 5 can be stamped therein in a simple manner. Holding device 4 provided with recesses 5 can then, in a next step, be placed in an injection mold in which the reflectors 3, depicted in cross section, can be injection-molded onto the sides 6 of the respective recesses 5. The semifinished product produced in this manner can thus be placed on and fastened to system carrier 1 in a single operation.

Figure 3:
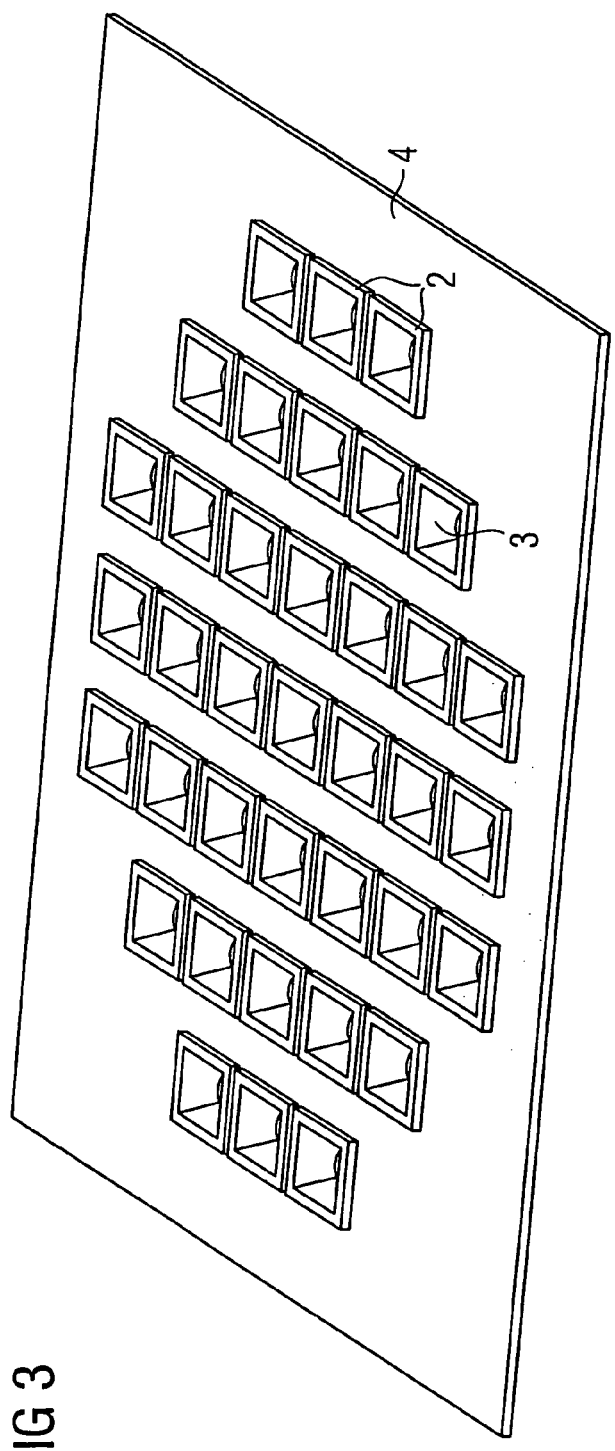
FIG. 3 is a schematic representation of a perspective view of a holding device provided with reflectors.
Figure 4:
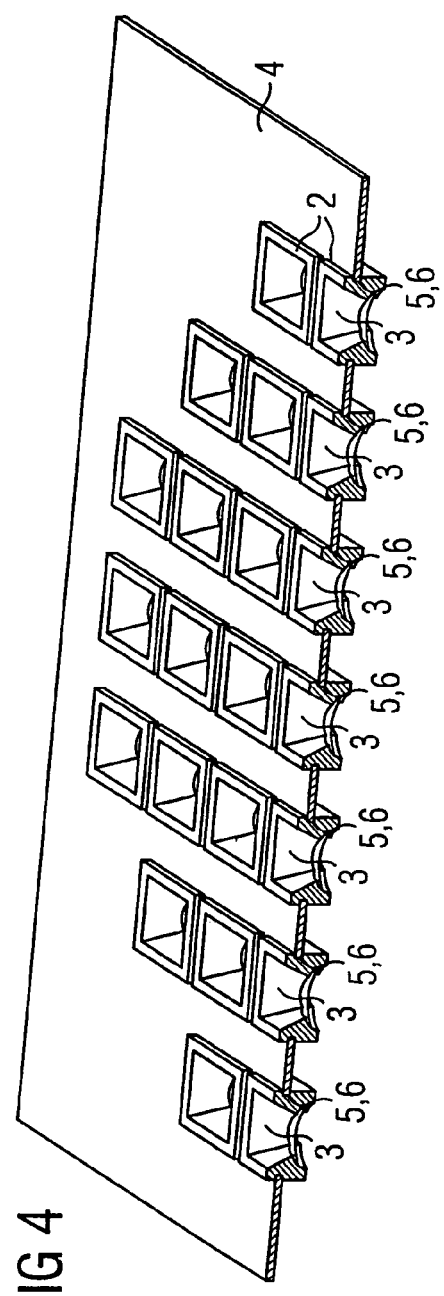
FIG. 4 is a schematic representation of a further perspective view of the holding device provided with reflectors, showing the arrangement from FIG. 3 in cutaway.

The semifinished product, composed of holding device 4 and reflector arrangement 2, that is used to make the radiation-emitting component is more readily appreciated from FIGS. 3 and 4. It is immediately obvious from these figures that holding device 4 is provided with a plurality of formed-on reflectors 3. From the cross-sectional representation of FIG. 4, it is clear that the reflectors have an expanse that is very slightly greater than that of the sides of the recesses 5, so as to enter into a positive-locking connection with holding device 4.

Figure 5:
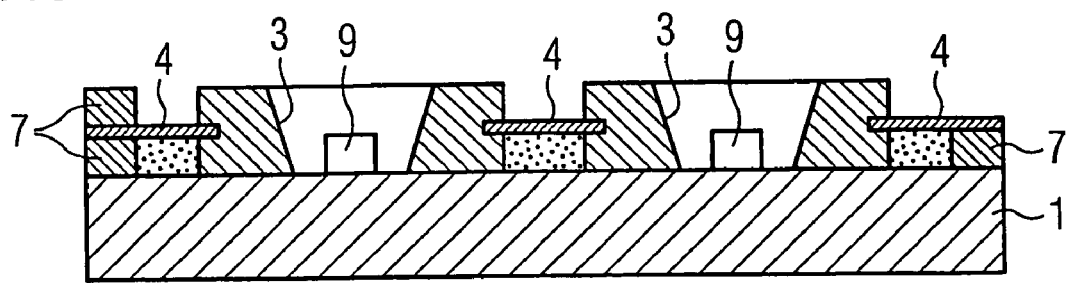
FIG. 5 is a schematic representation of a further exemplary embodiment comprising a mounting frame, in a cross-sectional view.

FIG. 5 shows a further exemplary embodiment, in which holding device 4 is provided with a mounting frame 7. Mounting frame 7 can merely be disposed between holding device 4 and system carrier 1, as illustrated in the right half of FIG. 5. It can also, however, be disposed on both sides of holding device 4, as illustrated in the left half. Mounting frame 7 preferably surrounds all of the reflectors provided in the radiation-emitting component. This makes it possible to fill the cavities formed between system carrier 1, holding device 4 and mounting frame 7 with a potting compound, in which case the mounting frame serves as a sort of "sealing ring." In addition, the mounting frame enables holding device 4 to be mounted on system carrier 1 in a particularly simple manner. The connection can be established by adhesive bonding, as is often the case, but it can also take the form of a screw or rivet connection made via the mounting frame. Mounting frame 7 can also be used to connect to an additional heat sink.

The inventive method counteracts the problem of the reflectors having different longitudinal expansions in the two lateral directions of a relatively large LED array. Mechanical problems that can arise between the plastic reflectors and the carrier made of another material are confined to a relatively small area comparable to that of discrete constructions. The inventive housing can therefore be used particularly advantageously in radiation-emitting components comprising a large number of LEDs.

Besides bringing about an improvement in mechanical properties, the supplemental holding device affords the possibility of being made to accommodate additional electrical terminals and wiring. All the considerations known from experience with leadframes can be applied in this case.

The invention is not limited by the description based on the exemplary embodiments. Rather, the invention encompasses any novel feature and any combination of features, including in particular any combination of features recited in the claims, even if that feature or combination itself is not explicitly mentioned in the claims or exemplary embodiments.

The invention claimed is:

1. A housing for at least two radiation-emitting components, comprising a system carrier and a reflector arrangement disposed on said system carrier, said reflector arrangement comprising a number of reflector elements each of which serves to receive at least one radiation-emitting component and which are fastened to one another by means of a holding device fabricated separately from said reflector arrangement, wherein said system carrier and said holding device are made of a first material having a first thermal expansion coefficient and said reflector arrangement of a second material having a second thermal expansion coefficient.

2. The housing as in claim 1, wherein
the material of said system carrier and the material of said holding device have similar or identical thermal expansion coefficients.

3. The housing as in claim 1, wherein said first material is a metal, a ceramic or a semiconductor.

4. The housing as in claim 1, wherein said second material is a plastic.

5. The housing as in claim 1, wherein said holding device functions as a leadframe for said radiation-emitting components.

6. A housing for at least two radiation-emitting components, comprising a system carrier and a reflector arrangement disposed on said system carrier, said reflector arrangement comprising a number of reflector elements each of which serves to receive at least one radiation-emitting component and which are fastened to one another by means of a holding device fabricated separately from said reflector arrangement, wherein said holding device comprises at least two recesses in each of which at least one reflector element is formed, onto said holding device.

7. The housing as in claim 6, wherein exactly one reflector element is formed in each recess.

8. The housing as in claim 1, wherein said holding device includes electrical leads that can be used for the electrical connection of said radiation-emitting components.

9. A housing for at least two radiation-emitting components, comprising a system carrier and a reflector arrangement disposed on said system carrier, said reflector arrangement comprising a number of reflector elements each of which serves to receive at least one radiation-emitting component and which are fastened to one another by means of a holding device fabricated separately from said reflector arrangement, wherein said holding device comprises a mounting frame by means of which said holding device, carrying said reflector arrangement, can be mounted on said system carrier.

10. The housing as in claim 9, wherein said mounting frame is arranged surroundingly around said reflector arrangement and is connected to said system carrier.

11. The housing as in claim 10, wherein-the space formed between said mounting frame, said system carrier and said holding device is filled with a potting compound.

12. The housing as in claim 1,
wherein-said holding device comprises terminal strips that can be used as surface-mountable contacts.

13. A radiation-emitting component, comprising at least two LEDs, wherein it comprises a housing according to claim 1.

14. The radiation-emitting component as in claim 13, wherein said LEDs are mounted on said system carrier.

15. A method of making a housing for a radiation-emitting component, wherein a number of reflector elements are formed onto a holding device made of a first material, adjacent reflectors being connected mechanically via said holding device, and said holding device, provided with said reflectors, is disposed on and fastened to a system carrier, wherein said system carrier and said holding device are made of a first material having a first thermal expansion coefficient and said reflector arrangement of a second material having a second thermal expansion coefficient.

16. The method as in claim 15, wherein said holding device is provided with recesses in which said reflector elements are formed on.

17. A method of making a housing for a radiation-emitting component as in claim 1, wherein a number of reflector elements are formed onto a holding device made of a first material, adjacent reflectors being connected mechanically via said holding device, and said holding device, provided with said reflectors, is disposed on and fastened to a system carrier, wherein said reflector elements are formed onto said holding device by means of an injection molding or transfer molding process.

18. A method of making a housing for a radiation-emitting component as in claim 1, wherein a number of reflector elements are formed onto a holding device made of a first material, adjacent reflectors being connected mechanically via said holding device, and said holding device, provided with said reflectors, is disposed on and fastened to a system carrier, wherein the connection of said holding device to said system carrier is effected via a mounting frame.

19. The housing as in claim 1, wherein the two radiation-emitting components are LEDs.

\* \* \* \* \*